United States Patent [19]

Tashiro et al.

[11] Patent Number: 4,857,139
[45] Date of Patent: Aug. 15, 1989

[54] METHOD AND APPARATUS FOR FORMING A LAYER

[75] Inventors: Mamoru Tashiro; Kazuo Urata; Shunpei Yamazaki, all of Tokyo, Japan

[73] Assignee: Semiconductor Energy Laboratory Co., Ltd., Tokyo, Japan

[21] Appl. No.: 140,903

[22] Filed: Jan. 4, 1988

Related U.S. Application Data

[63] Continuation of Ser. No. 801,769, Nov. 16, 1985, abandoned.

[30] Foreign Application Priority Data

Nov. 26, 1984 [JP] Japan .................................. 59-250339
Nov. 26, 1984 [JP] Japan .................................. 59-250341

[51] Int. Cl.[4] ........................... B44C 1/22; B05D 3/06; C03C 15/00; C03C 25/06
[52] U.S. Cl. ........................................ 156/643; 134/1; 156/646; 156/345; 118/724; 118/50.1; 118/620; 427/38; 427/53.1; 427/54.1
[58] Field of Search ..................... 134/1; 156/345, 643, 156/646, 663; 427/38, 39, 53.1, 54.1, 55, 56.1; 118/724, 725, 728, 50.1, 620

[56] References Cited

U.S. PATENT DOCUMENTS 4,495,218 1/1985 Azuma et al. .................. 427/54.1 XR
4,529,474 7/1985 Fujiyama et al. .................. 134/1 X
4,576,698 3/1986 Gallagher et al. .................. 134/1 X

FOREIGN PATENT DOCUMENTS 59-82732 5/1984 Japan .................................. 427/53.1

Primary Examiner—William A. Powell
Attorney, Agent, or Firm—Gerald J. Ferguson, Jr.

[57] ABSTRACT

A photo CVD apparatus includes a reaction chamber, a vacuum pump, and a light source chamber disposed in the reaction chamber, the light source chamber having a light window. A light source is provided in the light source chamber for irradiating the inside of the reaction chamber through the window. A device inputs reactive gas into the reaction chamber, and an electrode is disposed in the reaction space adjacent to the window and located between the substrate and the window. A method of depositing a layer on a substrate includes the steps of disposing a substrate in a reaction chamber, introducing a reactive gas, and initiating a photo-chemical reaction to deposit the product of the reaction on the substrate by irradiating the reactive gas with light emitted from a light source through a window of a light source chamber in which the light source is disposed. The substrate is then removed from the reaction chamber, and an etchant gas is introduced into the reaction chamber. A voltage is then applied between the substrate holder and an electrode which is located between the window and the substrate holder for carrying out plasma etching of the window.

28 Claims, 1 Drawing Sheet

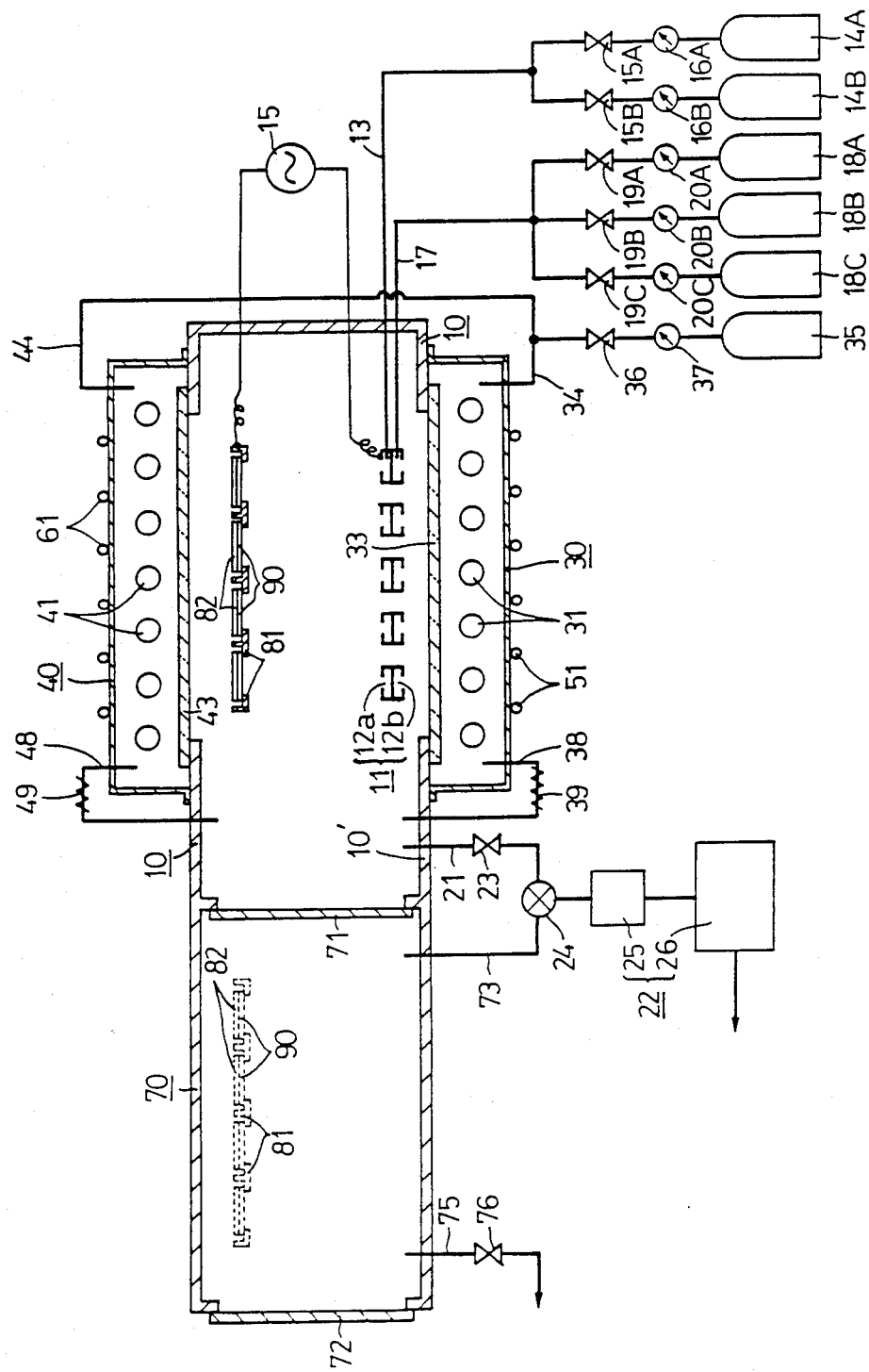

METHOD AND APPARATUS FOR FORMING A LAYER

This application is a continuation of Ser. No. 801,769, filed 11/26/85, now abandoned.

BACKGROUND OF THE INVENTION

1. Field of the Invention

The present invention relates to a layer forming method and apparatus suitable for use in the fabrication of various electronic devices of the type having an insulating, protecting, conductive, semiconductor or like layer formed on a substrate member.

2. Description of the Prior Art

Heretofore there has proposed a method for forming such a layer on a substrate member through use of a photo CVD process.

According to the method utilizing the photo CVD technique, the substrate memeber is placed in a reaction chamber provided with a light transparent window and a reactive gas mixture, which contains at least a gas of a material for the formation of the layer desired to obtain, is introduced into the reaction chamber. Then light is introduced into the reaction chamber through the light transparent window thereof by which the reactive gas mixture introduced thereinto is excited for vapor-phase decomposition and the material for the layer is deposited on the substrate member.

With the photo CVD process, since the material gas resulting from the vapor-phase decomposition of the photo-excited reactive gas is not accelerated, it is possible to form the layer on the substrate with substantially no damage inflicted on the substrate surface. On this account the layer can easily be formed without containing the material forming the substrate surface or without introducing into the substrate surface the material forming the layer, without developing any undesirable interface level between the layer and the substrate and without applying any internal stress to the layer and the substrate. Furthermore, since the photo-excited material gas has a characteristic to spread on the surface of the substrate member, the layer can be deposited in close contact with the substrate even if the substrate surface is uneven.

Accordingly, the use of the photo CVD technique permits easy formation of the layer of desired characteristics, without causing any damages to the substrate surface, even if the substrate has an uneven surface.

With the photo CVD process, however, an unnecessary layer of the material for the layer is deposited as well on the light transparent window during the formation of the layer. On this account, in the case where after the formation of the layer on the substrate member, a new layer of a composition identical with or different from that of the abovesaid material is formed on a new substrate member in the reaction chamber, the light to be introduced into the chamber through the light transparent window is partly intercepted by the unnecessary layer deposited on the window, so that a reactive gas mixture cannot effectively excited. Consequently, much time is needed for depositing the new layer. A conventional solution to this problem is to coat the window with oil of fluorine series which prevents the deposition of such unnecessary layer. But, when the window is given such a coating of oil, the layer being formed on the substrate is doped with an unnecessary impurity contained in the coating.

SUMMARY OF THE INVENTION

It is therefore an object of the present invention to provide a novel layer forming method and apparatus therefor which are free from the abovesaid defects of the prior art.

The method of the present invention comprises the steps of forming a layer on a substrate by the photo CVD process in a reaction chamber and cleaning the reaction chamber by plasma etching before or after the layer forming step.

According to such a method of the present invention, since the layer is deposited by the photo CVD technique on the substrate, even if the substrate surface is uneven, the layer can be deposited in close contact with the substrate surface and with substantially no damage thereon. Accordingly, the layer does not substantially contain the material forming the substrate surface, or the substrate surface does not substantially contain the material forming the layer. Further, the deposition of the layer is not accompanied by provision of an undesirable interface level between the layer and the substrate and the application of internal stresses to the first layer and the substrate.

Furthermore, according to the present invention, the interior of the reaction chamber is cleaned by the reaction chamber cleaning step. That is, during the formation of the layer on the substrate the material for the layer is unnecessarily deposited on the interior surfaces of the reaction chamber. But the present invention removes such unnecessary deposits by the cleaning step.

Accordingly, a layer of an intended composition and desired characteristics can always be formed on the substrate without containing the deposited material.

Moreover, the apparatus of the present invention for the abovesaid layer forming method comprises a means for introducing a layer-forming reactive gas into the reaction chamber from the outside thereof, a means for introducing a cleaning gas into the reaction chamber from the outside thereof, a means for exhausting gas from the reaction chamber, a means for exciting the layer-forming reactive gas by light, the reactive gas exciting means is provided with a light source chamber which optically communicates with the reaction chamber through a light transparent window and in which is disposed a light source for emitting the light, and a means for exciting the cleaning gas by electric power into a plasma.

With such an apparatus of the present invention, the layer forming step according to the manufacturing method of the invention can easily be carried out using the reaction chamber, the lever-forming reactive gas introducing means, the gas exhaust means and the layer-forming reactive gas exciting means and the reaction chamber cleaning step can also be easily performed using the reaction chamber cleaning gas introducing means, the gas exhaust means and the reaction chamber cleaning gas exciting means. Accordingly, the apparatus of the present invention permits easy implementation of the method of the invention.

Other objects, features and advantages of the present invention will become more fully apparent from the following detailed description taken in conjunction with the accompanying drawings.

BRIEF DESCRIPTION OF THE DRAWING

The accompanying sheet of a drawing schematically illustrates an example of the layer forming method of the present invention and an example of the apparatus used thereof.

DESCRIPTION OF THE PREFERRED EMBODIMENTS

A description will be given first of an apparatus for the formation of a layer according to the present invention.

The apparatus has a conductive reaction chamber 10. The reaction chamber 10 is provided with a plurality of conductive nozzles 11 arranged at the lower portion of the chamber 10 and each having upper and lower nozzle parts 12a and 12b. The conductive nozzles 11 are connected to one end of a power supply 15 for gas excitation.

A gas introducing pipe 13 is connected to the upper nozzle parts 12a of the nozzle 11 and extends out of the reaction chamber 10. The gas introducing pipe 13 is connected to a gas source 14A via a valve 15A and a flowmeter 16A and to another gas source 14B via a valve 15B and a flowmeter 16B.

Another gas introducing pipe 17 is connected to the lower nozzle parts 12b of the nozzle 11 and extends out of the reaction chamber 10. The gas introducing pipe 17 is connected to a gas source 18A via a valve 18A and a flowmeter 20A, to a gas source 18B via a valve 19B and a flowmeter 20B and to a gas source 18C via a valve 19C and a flowmeter 20C.

The reaction chamber 10 is provided with an exhaust pipe 21 which extends to the outside through the bottom wall of its extending portion 10' wherein the nozzles 11 are not placed. The exhaust pipe 21 is connected to a vacuum pump system 22 via a control valve 23 and a change-over valve 24. The vacuum pump system 22 has a tandem structure of a turbo pump 25 and a rotary pump 26.

Provided on the bottom wall of the reaction chamber 10 is a light source chamber 30, in which is disposed light sources 31 each of which emits light having a wavelength 300 nm or less, such as a low pressure mercury lamp. The light sources 31 are connected to an external power supply (not shown). Provided on the bottom wall of the chamber 30 are cooling pipes 51 which are connected to a cooling tower (not shown).

The reaction chamber 10 and the light source chamber 30 optically intercommunicate through a window 33 made in, for instance, a quartz plate disposed therebetween.

The light source chamber 30 has a gas introducing pipe 34 which extends to the outside through its one end portion of the bottom wall. The gas introducing pipe 34 is connected to a gas source 35 via a valve 36 and folwmeter 37. The light source chamber 30 has an exhaust piper 38 which extends from the other end portion of the bottom wall of the chamber 30 into the extending portion 10' of the reaction chamber 10. A heater 39 is provided on the exhaust pipe 38.

Disposed on the upper wall of the reaction chamber 10 is a heat source chamber 40, in which is disposed a heat source 51 formed by, for example, a halogen lamp. The heat source 41 is connected to anexternal power supply (not shown). Provided on the top wall of the chamber 40 is costing pipes 61 which are connected to the abovesaid costing tower.

The reaction chamber 10 and the heat source chamber 40 thermally intercommunicate through a window 43 made in, for example, quartz plate disposed therebetween.

The light source chamber 40 has a gas introducing pipe 44 which extends through its one end portion of the upper wall to the outside and is connected to abovesaid gas source 35 via the valve 36 and the flowmeter 37. The heat source chamber 40 has an exhaust pipe 48 which extends from its other end portion of the upper wall into the extending portion 10' of the reaction chamber 10. A heater 49 is provided on the exhaust pipe 48.

The reaction chamber 10 has attached thereto on the side of its extending portion 10' a substrate take-in/take-out chamber 70 with a shutter means 71 interposed therebetween. The shutter means 71 is selectively displaced to permit or inhibit the intercommunication therethrough between the chambers 10 and 70.

The chamber 70 has another shutter means 72 on the opposite side from the shutter means 71. The chamber 70 has an exhaust pipe 73 which extends from its bottom to the vacuum system 22 via the aforementioned change-over valve 24. The chamber 70 has another pipe 75 which extends to the outside and terminates into the atmosphere via a valve 76.

The aperture includes a conductive holder 81 for mounting a plurality of substrate members 90. The holder 81 is combined with thermally conductive press plates 82 for placing on the substrate members 90 mounted on the holder 81.

According to an example of the layer forming method of the present invention, the layer is deposited on the substrate member 90 through use of such an apparatus, as described hereinafter.

EMBODIMENT 1

A description will given of a first embodiment of the present invention for forming the layer as a insulating layer on the substrate member 90.

(1) The shutter means 71 between the reaction chamber 10 and the substrate take-in/take-out chamber 70, the shutter means 72 of the chamber 70 a valve 76 between the chamber 80 and the outside, the valves 15A and 15B between the nozzle parts 12a and the gas sources 14A and 14B, the valve 19A, 19B and 19C between the nozzle parts 12b and the gas sources 18A, 18B and 18C and the valve 36 between the chambers 30 and 40 and the gas source 35 are closed.

(2) Next, the valve 23 between the reaction chamber 10 and the vacuum pump system 22 is opened and change-over valve 24 is also opened to the both chambers 10, 70, 30 and 40 to a pressure of $10_{-7}$ Torr.

(3) Next, the turbo pump 25 and the rotary pump 26 of the vacuum pump system 22 are activated, evacuating the chambers 10 and 70.

(4) Next, the valve 23 is closed and the changeover valve 24 is also closed relative to the both chambers 10 and 70, followed by stopping of the vacuum pump system 22 from operation.

(5) Next, the valve 76 is opened, raising the pressure in the chamber 70 up to the atmospheric pressure.

(6) Next, the shutter means 72 is opened, through which the substrate 90 mounted on a holder 81 with, its surface for the formation thereon of the layer held down, is placed in the chamber 70 with a press plate 82 mounted on the substrate 90.

(7) Next, the shutter means 72 and the valve 76 are closed.

(8) Next, the change-over valve 24 is opened to the chamber 80 alone and the pump system 22 is activated, evacuating the chamber 80 to substantially the same vacuum as that in which the chamber 10 is retained.

(9) Next, the change-over valve 24 is closed relative to the both chambers 10 and 70 and then the pump system 22 is stopped from operation.

(10) Next, the shutter means 71 is opened, the holder 81 carrying the substrate 90 is moved from the chamber 70 into the chamber 10 and disposed at a predetermined position in the upper part of the chamber 10. At this time, the holder 81 is connected to the other end of the power source 15.

(11) Next, the shutter means 71 is closed.

(12) Next, the heat source 41 in the heat source chamber 40 is turned ON, heating the substrate 90 up to a temperature of 350° C.

(13) Next, the light source 31 in the light source chamber 30 is turned ON.

(14) Next, the valve 19A connected to the lower nozzle part 12b of the nozzle 11 in the reaction chamber 10 is opened, through which ammonia gas ($NH_3$) is introduced as a first reactive material gas from the gas source 18A into the chamber 10. At the same time, the valve 23 is opened and the valve 24 is opened relative to the chamber 10 alone and, further, the pump system 22 is activated, raising the pressure in the chamber 10 to 3 Torr. Then the valve 15B connected to the upper nozzle parts 12a of the nozzle 11 is opened, through which disilane ($Si_2H_6$) is introduced as a second reactive material gas from the gas source 14B into the chamber 10 to provide therein a gas mixture of the ammonia gas and the disilane. The pressure in the chamber 10 is held at 3 Torr by regulating the valve 23. In this instance, exhaust pipes 38 and 48 between the chambers 30 and 40 and the reaction chamber 10 are heated by heaters 39 and 49 mounted thereon, respectively. Even if the gas mixture flows back from the reaction chamber 10 in the pipes 38 and 48 toward the chambers 30 and 40, it is vapor-decomposed by heat to deposit silicon nitride and silicon on the interior surfaces of the pipes 38 and 48, preventing the silicon nitride and silicon from deposition on the inside surfaces of the chambers 30 and 40. Furthermore, in order to prevent such a reverse flowing of the gas mixture, the valve 36 is opened, through which nitrogen or argon gas is introduced from the gas source 35 into the chambers 30 and 40.

In such a condition, the gas mixture is excited by light from the light source 31 desposed in the light source chamber 31, by which it is excited and vapor-decomposed, depositing a silicon nitride layer as an insulating layer on the substrate member 90 at a rate of 17 A/min.

(15) Next, when the silicon nitride layer is deposited to a thickness of about 500 A the power source 15 is turned OFF and then the valve 15B 19A and 36 are closed but the valve 23 is fully opened, evacuating the chambers 10 and 30 to the same degree of vacuum as that under which the chamber 70 is held.

(16) Next, the valve 23 is closed and the pump system 22 is stopped and then the shutter means 71 is opened through which the holder 81 carrying the substrate member 90 with the insulating layer deposited thereon is moved from the chamber 10 to the chamber 70.

(17) Next, the shutter means 71 is closed and then the valve 76 is opened, through which the prssure in the chamber 70 is raised to the atmospheric pressure.

(18) Next, the shutter means 72 is opened, through which the holder 81 is taken out to the outside and then the substrate member 90 having formed thereon the insulating layer is removed from the holder 81.

In the manner described above, the insulating layer as the layer is formed on the substrate 90.

(19) Next, the holder 81 with no substrate member 90 mounted thereon is placed in the chamber 70, after which the shutter means 72 and the valve 76 are closed, the valve 23 is opened to the chamber 70 and the vacuum pump system 22 is put in operation, evacuating the chamber 70 to the same degree of vacuum as that under which the chamber 10 is retained.

(20) Next, the valve 24 is closed relative to the both chamers 70 and 10, after which the shutter means 71 is opened, through which the holder 81 is placed in the chamber 10, and then the shutter means 71 is closed.

(21) Next, the valve 19B connected to the lower nozzle parts 12b of the nozzle 11 is opened, through which nitrogen fluoride ($NF_3$ or $N_2F_4$) is introduced as a first cleaning gas form the gas source 18B into the chamber 10. On the other hand, the valve 23 is opened and the valve 24 is opened to the chamber 10 and then the pump system 22 is put in operation, holding the pressure in the chamber 10 at 0.1 Torr.

(22) Next, the power source 15 is turned ON.

In such a condition, the first cleaning gas is discharged or excited into a plasma by electric power from the power source 15, etching away unnecessary layers deposited on the inside surface of the chamber 10, the inside surfaces of the windows 33 and 34, the outside surface of the nozzle 11 and the outside surface of the holder 81. The unnecessary layers are composed of the materials of abovesaid first and second insulating layer.

(23) Next, when the unnecessary layers are almost etched away, the power source 15 is turned OFF and the valve 19B is closed, but the valve 19C is opened, through which hydrogen as a second cleaning gas, supplied from the gas source 18C, is introduced into the chamber 10, maintaining the pressure therein at 0.1 Torr.

(24) Next, the power source 15 is turned ON again. The second cleaning gas is discharged or excited into a plasma by electric power from the power source 15, cleaning the interior of the reaction chamber 10 including the windows 33 and 34, the nozzles 11 and the holder 81.

(25) Next, the power source 15 is turned OFF, after which the valve 19C is closed and the valve 23 is fully opened, through which the chamber 10 is evacuated. When the chamber 10 is evacuated to the same degree of vacuum as that under which the chamber 70 is retained, the valve 23 is closed, stopping the pump system 22 from operation.

Thus a series of steps for forming an insulating layer as a layer member on a substrate member is completed.

EMBODIMENT 2

Next, a description will be given of a second embodiment of the present invention for forming a semiconductor layer as the layer on a substrate member.

This embodiment forms an amorphous silicon layer as the semiconductor layer on the substrate member 90 by the same steps as those in Embodiment 1 except the following steps.

(12') In step (12) in Embodiment 1 the heating temperature of the substrate 90 is changed from 350° C. to 250° C.

(14') In step (14) of Embodiment 1 only the disilane ($Si_2H_6$) gas is introduced into the chamber 10 and the pressure in the chamber 10 is changed from 3 Torr to 2.5 Torr. A amorphous silicon layer is deposited as a semiconductor layer on the substrate 90.

EMBODIMENT 3

Next, a description will be given of a third embodiment of the present invention which forms an aluminum nitride (AlN) layer as a insulating layer on a substrate.

Embodiment 3 employs a same steps as those in Embodiment 1 except the following steps.

(14') In step (14) of Embodiment 1 methyl aluminum (Al(CH$_3$)$_3$), instead of the disilane, is introduced from the gas source 14A into the chamber 10, whereby a first aluminum nitride (AlN) layer is deposited as a first insulating layer on the substrate 90. In this case, the deposition rate of the first aluminum nitride layer is 230 A/min.

EMBODIMENT 4

Next, a description will be given of a fourth embodiment of the present invention which forms a insulating composite layer.

Embodiment 4 employs a same steps as those in Embodiment 1 except that the following step is added between the steps (14) and (15).

When the silicon nitride layer is deposited as a first silicon nitride layer to a thickness of about 500 A on the substrate member 90, the valve 23 is regulated and when the pressure in the chamber 10 is reduced to 1 Torr, the power source 15 is turned ON and then the light source 31 is turned OFF.

In such a condition, the gas mixture of the ammonia gas and the disilane is discharged or excited by electric power from the power source 15 into a plasma, in consequence of which a second silicon nitride layer is deposited on the first silicon nitride layer at a rate 2.1 A/sec to a thickness of about 0.5 μm.

While in the foregoing the present invention has been described in connection with the cases of forming an insulating layer of silicon nitride or alminum nitride, it is also possible to form an insulating layer different material selected from a group consisting of, for example, Si$_3$N$_4$, SiO$_2$, phosphate glass, borosilicate glass, and aluminum nitride. Also it is possible to form a conductive layer of such a metal as aluminum, iron, nickel or cobalt. Furthermore, a semiconductor layer of a material selected from the group consisting of, for example, Si, Si$_x$C$_{1-x}$ (where $0<x<1$), SiM$_x$ (where $0<x<4$ and M is such a metal as Mo, W, In, Cr, Sn or Ga) can also be formed. Moreover, although in the foregoing a low pressure mercury lamp is employed as the light source, an excimer laser (of a wavelength 100 to 400 nm), an argon laser and a nitrogen laser can also be used. Furthermore HF gas, a gas mixture of NF$_3$ gas and H$_2$ gas, NCl$_3$ gas can also be used as the cleaning gas.

It will be apparent that many modifications and variations may be effected with out departing from the scope of the novel concepts of the present invention.

What is claimed is:

1. A layer forming method comprising the steps of:
    forming a layer on a substrate by a photo CVD process in a reaction chamber which is held to 2.5 to 3 Torr; and
    cleaning the reaction chamber by plasma etching before or after the layer forming step.

2. A layer forming method comprising the steps of:
    forming a layer on a substrate by a photo CVD process in a reaction chamber;
    introducing light from a mercury lamp into the reaction chamber while forming said layer; and
    cleaning the reaction chamber by plasma etching before or after the layer forming step.

3. A layer forming method comprising the steps of:
    forming a layer on a substrate by a photo CVD process in a reaction chamber;
    introducing a gas selected from the group consisting of a gas mixture of ammonia and silane, disilane gas or methyl aluminum into the reaction chamber; and
    cleaning the reaction chamber by plasma etching before or after the layer forming step.

4. A layer forming method comprising the steps of:
    forming a layer on a substrate by a photo CVD process in a reaction chamber;
    cleaning the reaction chamber by plasma etching before or after the layer forming step; and
    introducing a gas selected from the group consisting of nitrogen fluoride or hydrogen as a cleaning gas into the reaction chamber.

5. A method for depositing a layer on a substrate comprising the steps of:
    disposing a substrate on a substrate holder in a reaction chamber;
    introducing a reactive gas in said reaction chamber;
    initiating photo-chemical reaction to deposit the product of said reaction on said substrate by irradiating said reactive gas with light emitted from a light source through a window of a light source chamber in which said light source is placed;
    removing said substrate from said raction chamber;
    introducing etchant gas into said reaction chamber; and
    applying a voltage between said substrate holder and an electrode which is located between said window and said substrate holder for carrying out plasma etching of said window.

6. A method of claim 5 further comprising:
    disposing again said substrate in said chamber; and
    depositing on said substrate the product of CVD enhanced by plasma generated by discharge between said electrode and said holder.

7. A method of claim 6 wherein said layer is made of silicon nitride, amorphous silicon, or aluminum nitride.

8. A method of claim 6 wherein said layer is made of iron, nickel, cobalt or their compound.

9. A layer forming method comprising the steps of:
    forming a layer on a substrate disposed on a substrate holder by a photo CVD prodcess in a reaction chamber having light transparent window; and
    cleaning the reaction chamber by plasma etching before or after the layer forming step with an electrode fixedly disposed between said substrate holder and said window.

10. A layer forming method according to claim 9 wherein in the step of forming the layer, the reaction chamber is held to 2.5 to 3 Torr.

11. A layer forming method according to claim 9, wherein in the step of forming the layer, a light from a mercury lamp is introduced in the reaction chamber.

12. A layer forming method according to claim 9, wherein in the step of forming the layer, a gas selected from the group consisting of a gas mixture of ammonia and silane, disilane gas or methyl aluminum is introduced as a material gas in the reaction chamber.

13. A layer forming method according to claim 9, wherein in the step of cleaning the reaction chamber, a gas selected from the group consisting of a nitrogen fluoride or hydrogen is introduced as a cleaning gas in the reaction chamber.

14. A method for depositing a layer on a substrate comprising the steps of:
disposing a substrate on a substrate holder in a reaction chamber;
introducing a reactive gas in said reaction chamber;
initiating photo-chemical reaction to deposit the product of said reaction on said substrate by irradiating said reactive gas with light emitted from a light source through a window of a light source chamber in which said light source is placed;
removing said substrate from said reaction chamber;
introducing etchant gas into said reaction chamber; and
applying a voltage between said substrate holder and an electrode which is fixedly located between said window and said substrate holder for carrying out plasma etching of said window.

15. A method of claim 14 further comprising:
disposing again said substrate in said chamber; and
depositing on said substrate the product of CVD enhanced by plasma generated by discharge between said electrode and said holder.

16. A method of claim 15 wherein said layer is made of silicon nitride, amorphous silicon, or aluminum nitride.

17. A method of claim 15 wherein said layer is made of iron, nickel, cobalt or their compound.

18. An apparatus comprising:
a reaction chamber;
means for introducing a layer-forming reactive gas into the reaction chamber from the outside thereof;
means for introducing cleaning gas into the reaction chamber from the outside thereof;
means for exhausting gas from the reaction chamber; and
means for exciting the layer-forming reactive gas by light;
wherein the gas exciting means is provided with a light source chamber which optically communicates with the reaction chamber through a light transparent window and in which is disposed a light source for emitting light, and means for exciting the cleaning gas by electric power into a plasma.

19. A photo CVD apparatus comprising:
a reaction chamber defining a reaction space therein;
a vacuum pump for evacuating said reaction chamber;
a light source chamber provided in said reaction chamber with a light window;
a light source provided in said light source chamber for irradiating the inside of said reaction chamber through said window as a partition therebetween;
means for inputting reactive gas into said reaction chamber; and
an electrode provided in said reaction space just adjacent to said window and located between said substrate and said window.

20. An apparatus of claim 19 wherein said substrate is disposed in a direction perpendicular to the propagating direction of light from said light source.

21. An apparatus of claim 19 further comprising a holder on which is mounted said substrate with the surface to be coated facing downward.

22. An apparatus of claim 19 wherein said electrode functions as a first nozzle means by which said reactive gas is introduced into said reaction chamber.

23. An apparatus as in claim 22 wherein said electrode includes second nozzle means for introducing a further reactive gas into said reaction chamber where the reactive gas introduced by said first nozzle means decomposes into a gas and that introduced by the second nozzle means decomposes into a solid and where the first nozzle means faces the window and the second nozzle means faces the substrate.

24. An apparatus as in claim 23 where the reactive gas introduced by the second nozzle means is a silane gas and the gas introduced by the first nozzle means is ammonia.

25. An apparatus comprising:
a reaction chamber;
means for introducing a layer-forming reactive gas into the reaction chamber from the outside thereof for forming a layer on a substrate disposed on a substrate holder;
means for introducing cleaning gas into the reaction chamber from the outside thereof;
means for exhausting gas from the reaction chamber, and
means for exciting the layer-forming reactive gas by light;
wherein the gas exciting means is provided with a light source chamber which optically communicates with the reaction chamber through a light transparent window and in which is disposed a light source for emitting light, and electrode means for exciting the cleaning gas by electric power into a plasma, said electrode means being fixedly disposed between said window and said substrate holder.

26. A photo CVD apparatus comprising:
a reaction chamber defining a reaction space therein;
a vacuum pump for evacuating said reaction chamber;
a light source chamber provided in said reaction chamber with a light window;
a light source provided in said light source chamber for irradiating the inside of said reaction chamber through said window as a partition therebetween;
means for inputting reactive gas into said reaction chamber; and
an electrode fixedly provided in said reaction space just adjacent to said window and located between said substrate and said window for cleaning said light window.

27. An apparatus of claim 26 wherein said substrate is disposed in a direction perpendicular to the propagating direction of light from said light source.

28. An apparatus of claim 26 further comprising a holder on which is mounted said substrate with the surface to be coated facing downward.

* * * * *